United States Patent [19]

Hoppe

[11] 3,971,936
[45] July 27, 1976

[54] CORPUSCULAR BEAM MICROSCOPE, PARTICULARLY ELECTRON MICROSCOPE, WITH ADJUSTING MEANS FOR CHANGING THE POSITION OF THE OBJECT TO BE IMAGED OR THE IMAGE OF THE OBJECT

[75] Inventor: Walter Hoppe, Martinsried near Munich, Germany

[73] Assignee: Max-planck-Gesellschaft zur Forderung der Wissenschaften e.V., Gottingen, Germany

[22] Filed: Aug. 6, 1975

[21] Appl. No.: 602,461

[30] Foreign Application Priority Data

Aug. 27, 1974 Germany............................ 2441288

[52] U.S. Cl................................ 250/311; 250/306; 250/442
[51] Int. Cl.²......................................... H01J 37/26
[58] Field of Search ........... 250/306, 307, 309, 310, 250/311, 396, 397, 442, 505

[56] References Cited

UNITED STATES PATENTS 3,700,895  10/1972  Dicke................................... 250/505

*Primary Examiner*—Alfred E. Smith
*Assistant Examiner*—B. C. Anderson
*Attorney, Agent, or Firm*—Kenyon & Kenyon Reilly Carr & Chapin

[57] ABSTRACT

The determination and correction of the image drift in an electron microscope is accomplished using a correction signal obtained by forming the convolution product of an actual object image (instantaneous microscope image) and a reference object image (microscope image at an earlier point in time) whose change in position is proportional to the image drift. The convolution product preferably is formed using an optical analog computer. To correct the image drift, the correlation signal is used as the controlled variable which acts on the image adjusting means.

12 Claims, 18 Drawing Figures

CORPUSCULAR BEAM MICROSCOPE, PARTICULARLY ELECTRON MICROSCOPE, WITH ADJUSTING MEANS FOR CHANGING THE POSITION OF THE OBJECT TO BE IMAGED OR THE IMAGE OF THE OBJECT

BACKGROUND OF THE INVENTION

The invention relates to a corpuscular beam microscope such as electron microscopes in general and more particularly to such a microscope with adjusting means for changing the position of the object to be imaged relative to the equipment axis and/or relative to the focusing plane of the objective lens on the specimen side and/or for changing the position of the image of the object relative to the equipment axis.

Adjusting means for changing the position of the object to be imaged relative to the equipment axis are to be understood herein as the usual devices which serve for the mechanical displacement of the object (specimen) or the object carrier in the horizontal direction, e.g. in two coordinates $(x, y)$. It is known to drive such adjusting devices using motors (German Pat. Nos. 1,564,657 and 1,614,528). To change the position of the object relative to the focusing plane on the specimen side, it is possible to either change the excitation of the objective lens or raise or lower the object mechanically along the equipment axis (e.g., German Pat. No. 1,514,595). Displacement of the object image relative to the equipment axis can be accomplished by a deflection system arranged below the objective lens (Siemens Publication Eg 1/204, January, 1969).

Where photographic recording of the image is to be carried out, the effective resolution of corpuscular beam microscopes depends decisively on the quietness of the picture; the latter, in turn, is the better with better regulation of the electrical operating parameters. In particular, such is accomplished when the beam voltage and the lens currents are regulated for constancy and the less the object itself moves. In principle, the electrical operating parameters can be controlled using proper control circuits, but thermal motion (drift) of the object can hardly be avoided, particularly if the object is cooled or heated. In high resolution electron microscopes a position stability of the object of, at best, on the order of 0.1 A/s is achieved.

SUMMARY OF THE INVENTION

The present invention achieves in a corpuscular beam microscope of the type mentioned above, substantially greater quietness of the image than has been possible heretofore. To solve this problem, an arrangement for controlling the condition of the object image is provided, according to the present invention, whose controlled variables acting on the adjusting devices are derived from convolving the actual object image with a stored reference object image. The basic principle of the present invention resides in correlating the objective image with a previous state of itself. The convolving operation provided for this purpose can be carried out, for instance, by means of a light-optical analog computer, of which several embodiments are described below. The convolution can also be calculated by a digital computer; it is then necessary to measure the intensities of the actual and the reference object image in raster fashion using methods well known in the art of evaluating images by computer.

In corpuscular beam microscopes with a device for tilting the object relative to the equipment axis, the present invention solves another problem. In general, such a tilting of the object about a tilting axis perpendicular to the equipment axis, unless the tilting axis is in the viewed area of the object, causes this area to wander in the horizontal $x$-$y$ plane as well as vertically in the $z$-direction. The present invention allows the viewed area of the object to be locked in the picture even in such a case, and even in the face a readjustment of the focus that may become necessary because of wandering in the $z$-direction. Although the actual object image is changed considerably from the reference object image which was obtained with the object untilted, a sufficiently defined autocorrelation signal can still be obtained by the convolution even up to large tilting angles.

From the German Pat. No. 1,905,894 an information storage system with a corpuscular beam scanning the information is known, in which part of a storage layer loaded with information markings is enlarged and projected by the corpuscular beam onto a detector matrix. For better correlation of the information markings with the detector matrix by means of a deflection system, special adjustment markers are provided on the storage layer which generate adjustment signals in cooperation with certain detectors. A control signal which is fed to the deflection system is obtained from these adjustment signals. In this manner, image shifts caused by drift can also be automatically corrected.

In contrast thereto no artificial markings on the object are necessary in the control arrangement for the corpuscular beam microscope according to the present invention since the object image as a whole is correlated with a former state of itself as noted above. The control according to the present invention does not even presuppose particularly salient details in the object image; rather, it works well particularly with objects of random structure, e.g. a carbon film.

BRIEF DESCRIPTION OF THE DRAWINGS

FIG. 3b is an optical diagram illustrating in one dimension how the convolution product can be formed using the arrangement of FIG. 3a.

FIG. 4a is a similar one dimensional view of a further alternate embodiment to that of FIGS. 2a and 3a.

FIG. 4b is a simplified diagram of apparatus employing the principle of FIG. 4a.

FIG. 6b illustrates an arangement which can be used for obtaining the diffractogram of FIG. 6a.

DETAILED DESCRIPTION OF THE PREFERRED EMBODIMENT

First, the mathematical operation of convolution will be explained in the following:

A function $f_{x,y}$ which is to be convolved with the function $g_{x,y}$ is assumed as given. To this end, the function $g_{x,y}$ is taken and its origin positioned to any point of the function $f_{x,y}$. The function $g_{x,y}$ is also imaged (mapped) in this operation with a weight which corresponds to the product of $g_{x,y}$ and the value of the point of $f_{x,y}$. This operation is imagined to be repeated for all points of $f_{x,y}$. The resulting image therefore consists of a large number of superimposed images of $g_{x,y}$, which are mutually displaced according to $f_{x,y}$. In connection with the present invention, the convolution of $f_{x,y}$ with a function $g_{x,y}$ which is generated by a 180° rotation about a normal to the plane is of particular interest. This special function is hereinafter designated as $f_{x,y}*$. This convolution leads to a resulting function (autocorrelation function) which is distinguished by a particularly high maximum. The results of convolutions of two functions are mathematically called convolution products. Such convolution products can be realized, for instance, in light optical computers.

Within the scope of the present invention, the electron microscopic object image is described by the function $f_{x,y}$. It can be shown that convolution of the function $f_{x,y}$ with the function $f_{x,y}*$, which is rotated by 180°, has a strong maximum at the origin, the autocorrelation maximum. If the function $f_{x,y}$ is now displaced by an amount $d$ with the components $x_o$ and $y_o$ and the function $f_{x,y}*$ is left unchanged, then the autocorrelation function given by the convolution product with its maximum is also displaced by the amount $d$ with the components $x_o$ and $y_o$.

Figure 1:
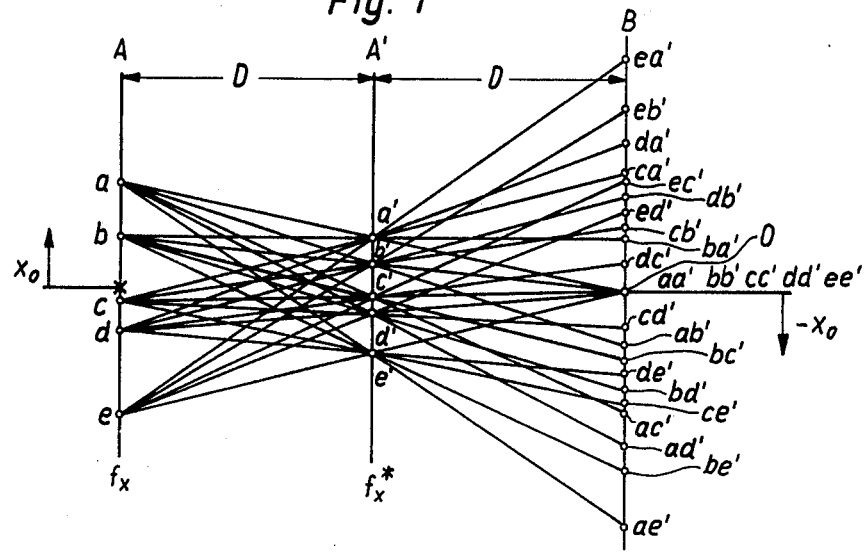
FIG. 1 is an optical schematic illustrating the principle of the present invention.

The principle of an incoherent light-optical computer for realizing a convolution is shown in FIG. 1. For the sake of clarity, a one-dimensional function $f_x$ is considered instead of a two-dimensional function $f_x$. For the same reason, $f_x$ is assumed to be a point function which consists of points $a$, $b$, $c$, $d$, $e$ lined up on a line A. This point function can be obtained, for instance, in a light-optical computer with a row of small lamps which are arranged at the points $a$ to $e$, or by a hole template which is placed in front of an evenly luminous surface so that light can pass only at the points of the holes. The function $f_x*$ with the points $a'$ to $e'$ corresponds completely to the function $f_x$ but with the points rotated with respect to $f_x$ by 180°. The points $a$ to $e$ are therefore arranged in the reverse order. In FIG. 1, the function $f_x*$ is shown along a line A' on a scale reduced 1:2 and again reversed with respect to $f_x*$ and therefore with the same orientation as $f_x$. However, the reduction in scale and the inversion of $f_x*$ has nothing to do with the principle of the mathematical convolution; it is necessary only because of the design principle of this special embodiment. The reduction by 1:2 is necessary because the computer works with central projection, with the distances AA' and A'B equal; the additional rotation of the function $f_x*$ by 180° results from the geometrical ray path in the imaging process. There are optical computers, in which, for instance, the change of scale of the two functions need not be performed; a corresponding example will be described later with reference to FIG. 3.

The function $f_x*$ can also be realized with a hole mask. The second hole mask is arranged parallel to the first mask at the distance D. With the luminous points $a$ to $e$ on A, illumination through the holes $a'$ to $e'$ is imaged on A' a screen arranged on the line B, whose distance from A' is again D. The light pattern that is imaged on B corresponds to the convolution of $f_x$ with the function $f_x*$ (not reduced and reversed with respect to $f_x$).

The light pattern in B of FIG. 1 can be constructed by drawing the light rays that emanate from the individual points on A and are passed by the hole mask on A'. Thus, a light point is produced, for instance, at the point $cb'$ of B because it is illuminated by the point $c$ through the hole $b'$. The hole $b'$ therefore acts, so to speak, as a pin hole camera for imaging the radiating point $c$. Diffraction effects are ignored here with this pin hole camera projection, or steps must be taken to make sure that they remain negligibly small by making the dimensions of the apparatus accordingly. If the ray construction for all the light points on A and for all the holes on A' is carried out, it will be seen that the light pattern on B consists of 21 light points (generally, $N^2 - N + 1$, N being the number of points on A), of which 20 light points are illuminated by a single ray, but the 21st light point (in FIG. 1, at 0) is illuminated by 5 light rays (generally, N light rays). This light point is therefore 5 times as bright (generally, N times) as the other light points.

If the luminous points on A are now displaced by a distance $x_o$ (FIG. 1) then the light pattern in B is also shifted and therefore also the bright point in the center of the light pattern, by a distance $-x_o$ as is evident.

These relations can be generalized two dimensionally by arranging two dimensional hole masks A and A' and a screen B parallel to each other. The two dimensional point functions given by the arrangement of the holes of the two hole masks at A and A' can further be replaced by a continuous density distribution, i.e. a picture. In the latter case, the light pattern B is a diffusely illuminated pattern from which one very bright point again stands out. This bright point constitutes a very useful signal for the position of the image in A.

If the actual objective image in the plane A is now generated, for instance, on a fluorescent screen and the stored reference object image brought into the plane A', the bright spot is identical to the autocorrelation maximum. With the reference object image in A' held stationary, a movement (drift) of the actual object image in A leads to a deflection of the bright spot in B which is proportional to the deflection of the actual object image. The deflection of the autocorrelation maximum and, therefore, of the actual object image in A can be ascertained advantageously using a location sensitive detector array arranged in the plane B. The detector can be, for instance, a detector array pattern of photoelectric elements or the light-sensitive target layer of a television camera.

The convolution of the actual object image with the reference object image can be accomplished in various ways. Thus, it is possible, for instance, to use the light-optical computer described above. In this case, the reference object image can be stored, for instance, photographically. Information is then available in the form of amplitude modulation; this means that the amplitude of a light wave passing through the reference object image is attenuated in accordance with the density of this picture. Such amplitude information can also be produced, for instance, by means of a photochromic layer.

In addition to the two described possibilities for storing the reference object image in the form of amplitude modulation, it is also possible to fix this image as phase information, i.e. in the form of a phase object. In that case, the light, when passing through the reference object image, is subjected to a phase shift corresponding to the structure of the latter. The storage of the reference object image in this manner can be accomplished, for instance, through use of a photothermoplastic layer. It is also possible to use an Eidophor tube for storing the reference object image. Such a tube, which is commonly used for large television projection displays, comprises a light controlling device which consists of a viscous liquid placed on a metal plate. The surface of the liquid is locally deformed by an electron beam which is modulated in accordance with the picture to be reproduced.

In order to perform a convolution with the actual object image where the reference object image is stored in the form of a phase object, it is advantageous to impart to the actual object image a grid-like structure and to arrange a grid-like mask near the reference object image with the grid constants of the structure of the actual object image and the mask identical. In this case the convolution of the two images is the realization of a mathematical theorem which states that if both functions to be convolved are defined as grid functions with the same grid, the convolution product must also be defined in the same grid.

The display of the actual object image can be, for instance, on the fluorescent screen of a television tube. The beam voltage used for the brightness control of the image spots of the tube will be proportional to the brightness of the image points of the original actual object lamp. In addition, a television tube permits inverting the contrast of the actual object image. If the positive of the reference object image is convolved with the negative of the actual object image, the autocorrelation maximum becomes a dark point which can be distinguished clearly from the brighter background.

The use of a television tube also makes it possible to enhance the contrast of this image. This can be achieved, for instance, by controlling the beam voltage according to the second, third, . . . power of the brightness of the original image through use of a computing member or the like preceding the television tube.

With such an arrangement, the contrast of the reference object image can also be enhanced in a similar manner. The image then available can likewise be stored photographically. The convolution of the reference and actual object images with improved contrast then results in an autocorrelation signal whose maximum strongly stand out from that of the surrounding signals.

If the actual object image has a background brightness from which only a few points stand out brighter or darker, it is furthermore possible to display the actual object image on the television screen in the form of a difference image between the actual object image and a background to be subtracted therefrom instead of directly. The background may have a brightness which corresponds to the brightness of the dark points of the actual object image for example. Thus, the actually displayed actual object image shows the characteristic details of the original image in a particularly pronounced way. The different image display can be realized, for instance, by providing the beam voltage of the television tube with a constant bias which corresponds to the brightness of the dark points of the original actual object image.

An alternative is to use only those elements of the original image which are brighter than the background brightness of the image as the actual object image. The television image is then brightened only at the points corresponding to these elements. In this case the beam voltage is provided with a constant bias which corresponds to the background brightness of the image.

As described above, the formation of the convolution product from an actual and a reference object image according to the present invention is also suitable for ascertaining a defocusing of the actual object image. Such defocusing can occur, for instance, if the lens excitation of the microscope or the position of the object along the axis changes. It can also be caused by tilting of the object. Since an electron microscope normally operates with coherent illumination and very frequently in a coherent bright field, the actual object image retains its basic resolution; it changes only qualitatively. New structures are produced which in general are related to a change of the brightness of the autocorrelation maximum; this change can even lead to a complete contrast reversal in the plane of the autocorrelation signal. At the same time, alternating strongly and weakly illuminated rings appear which are concentric to the maximum. The distance of these rings from the center depends on the defocusing. These rings (and, therefore, the defocusing of the actual object image) can be detected by arranging concentric ring detectors in the plane of the autocorrelation signal and bringing them into a position concentric with the maximum.

In addition to the possibilities described above for forming the convolution product from the actual and the reference object image using incoherent light-optical computers, it is also possible to perform a Fourier transformation of the actual and the reference object image, to link the Fourier coefficients with each other by multiplication and to perform a Fourier transformation of the product. The basis for this is the mathematical theorem that the formation of the convolution of two functions corresponds to the multiplication of the Fourier coefficients of the two functions.

This possibility can be carried out with a digital computer. A further possibility using a coherent light-optical computer also exists. In that case, the fact that the diffraction pattern of an image in the focal plane of a lens corresponds to the (mathematical) Fourier transformation of the image is utilized. If a coherent light-optical computer is used for forming the convolution product of two functions, which characterize actual and reference object images, the Fourier transform of the reference object image is stored, for instance, on a photographic plate, as a rule in the form of a hologram. Such a hologram can be formed, for instance, by superimposing a coherent reference ray on a light diffractogram of the image and storing it.

An advantageous embodiment of the coherent light-optical computer includes arranging a filter for recording the autocorrelation signal, on which a Fourier transform hologram is registered between the actual object image, which is illuminated with coherent light, and the above-mentioned location sensitive array detector. The hologram is arranged so that a light diffractogram of the actual object image is produced on it. The autocorrelation signal can be obtained from the diffraction pattern in the focal plane of a further lens following the hologram.

Another advantageous possibility for obtaining the control variables for the adjusting device(s) of the electron microscope is to derive these variables from the Fourier transform of the convolution of the reference and the actual object image. The formation of this Fourier transform can be accomplished in a particularly simple manner by the generation of the Fourier transform square of a double image superposed from the reference and the actual object image. The square of the Fourier transform of an image in turn is obtained automatically in storing this image in one of the storage devices mentioned, e.g. a photographic plate. If the diffraction pattern of the superposition of the reference and the actual object image is generated the sum $F + F'$ of the Fourier transform of the reference object image (F) and the Fourier transform of the actual object image (F') is obtained. On a photographic plate, the product of the sum of these two functions and the sum of their conjugate complex $F^*$ and $F'^*$ is now formed. On the photographic plate the sum of the four products $F \cdot F^*$, $F \cdot F'^*$, $F' \cdot F^*$, and $F' \cdot F'^*$ is now impressed. The product $F' \cdot F^*$ represents the Fourier transform of the convolution of the reference object image, rotated 180°, and the product $F \cdot F'^*$ represents the Fourier transform of the convolution of the reference object image with the actual object image, rotated 180°. If the actual object image is now displaced relative to the reference object image by a distance $u$ (drift), then a system of parallel, illuminated stripes with dark lines in between will appear on the photographic plate. Along a line perpendicular thereto, the illumination follows a $\cos^2$ law, i.e. it has a maximum between two dark lines and drops to zero according to a $\cos^2$ curve. The distance $v$ between two dark lines is proportional to the reciprocal of the drift displacement $u$; the normal to the dark lines has the same direction as the drift displacement.

Figure 2A:
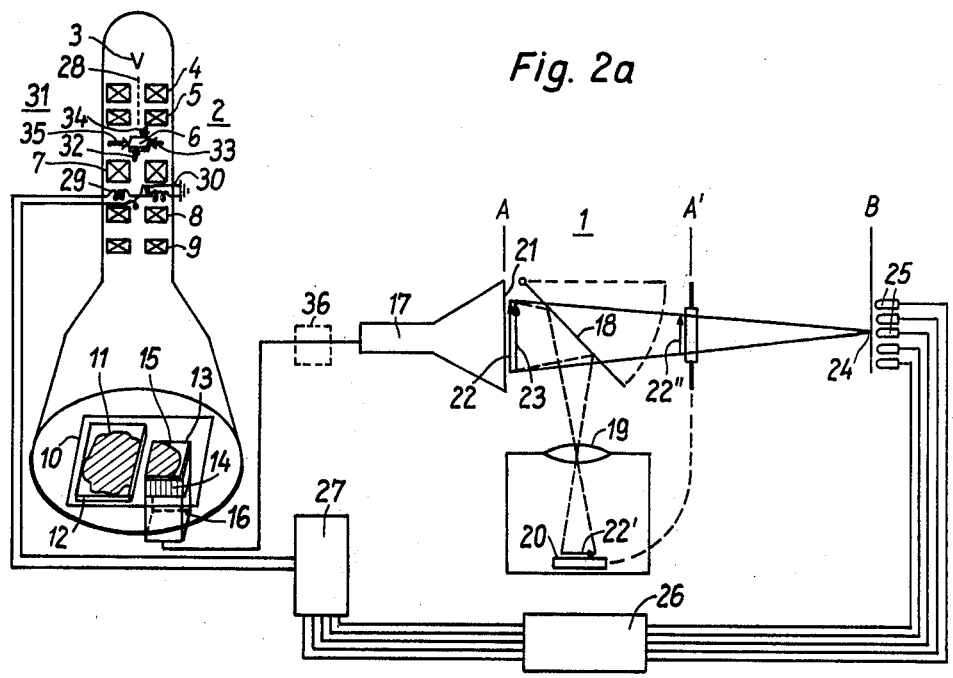
FIGS. 2a–e illustrate an arrangement for correcting the image of an electron microscope, in which the determination of the drift is accomplished by means of an incoherent light optical computer which forms a convolution product of an actual and a reference object image by means of shadow projection.

In FIG. 2a, a light-optical computer 1 for compensating the image drift of an electron microscope 2 is shown. The electron microscope 2 comprises an electron source 3, condenser lenses 4 and 5 for illuminating the object 6 to be examined, an objective lens 7, an intermediate lens 8 and a projection lens 9. The latter generates an image of the object 6 in the final image plane 10 of the microscope 2. A part 11 of this image is to be recorded on a photographic plate 12. Beside the photographic plate 12 a front-view transparent fluorescent screen 13 is arranged. Fiber optics 14 are situated underneath and feed a further part 15 of the microscope image to a television camera 16. Since in case of drift of the entire image generated in the image plane 10 of the microscope 2, the two partial images 11 and 15 are displaced in the same manner it is possible to determine the quietness of the partial image 11 during the exposure of the photographic plate 12 using the partial image 15. This determination is made by correlating the partial image 15 with a previous state of itself. The convolving operation provided for this purpose is performed by means of the light-optical computer 1.

The computer 1 consists of a television display tube 17 i.e. CRT, controlled by the television camera 16, arrangements for recording the reference object image, i.e. for recording of the partial image 15 at an earlier point in time, and means for comparing the actual object image, i.e., the instantaneous partial image, with the reference object image. The reference object image is registered on a photographic plate 20 prior to the exposure of the photographic plate 12 through a mirror 18 swung into the ray path of the computer 1 and a light lens 19. The lens 19 images the partial image 15 reproduced on the television screen 21 reduced in scale 2:1 (see the arrows 22 and 22'). The photographic plate 20 is developed and placed in the plane A'. The reference object image (arrow 22'') is then illuminated by the actual object image (arrow 23) indicated on the television screen 21 in the plane A. In the plane B, the autocorrelation signal can be seen as a bright spot 24 (autocorrelation maximum). Any drift of the actual object image (arrow 23) leads to a deflection of this spot 24 proportional to the drift distance. The determination of the position and the motion of the autocorrelation maximum is accomplished with a position sensitive array detector, e.g. a detector surface pattern of photoelectric elements (photo diodes) 25, which are arranged in the plane B in the form of a matrix. These are connected with servo devices 26, by means of which the drift of the microscope image is corrected. This correction is accomplished with conventional adjusting devices 27 connected to the output of the servo devices 26 by changing the position of the object 6 relative to the axis 28 of the microscope 2 and/or relative to the focusing plane on the specimen side of the objective lens 7 and/or by changing the position of the object image relative to the equipment axis 28.

An example of how such an adjustment may be made is shown on FIG. 2a. The change is caused by voltage sources, not shown, which are controlled by the servo devices 26 and which excite two pairs of coils 29 and 30 arranged at right angles to each other, according to the required position change of the microscope image. Through deflection of the imaging ray beam a fine displacement of the image for correcting small drifts is thereby possible. Also shown on FIG. 2a is a device 31 for changing the position of the objective lens 6 relative to the microscope axis 28. The device 31 consists of four plungers 32 to 35, which permit displacement of the object 6 in the two directions perpendicular to the equipment axis 28. Since with such a displacement, a mechanical and therefore, relatively inaccurate change is involved, this will generally only be used to move the object 6 in the case of large drifts of the microscope image. Smaller drifts are corrected using the pairs of coils 29 and 30 as described above.

It should be noted at this point that the drift correction of the actual object image can also be done manually instead of automatically with a control loop. For this purpose, a fluorescent screen can, for instance, be provided in the plane B on which the autocorrelation maximum is displayed as a bright (or dark) spot. Any change in position of this spot can be compensated manually by changing the current flowing through the deflection coils or by displacing the object.

As explained above, it is possible to reproduce the partial image 15 with enhanced contrast. In that case, a computing member 36, which controls the beam voltage of the television tube 17 in proportion to the square of the brightness of the partial image 15, is interposed between the television camera 16 and the tube 17.

Figure 2B:
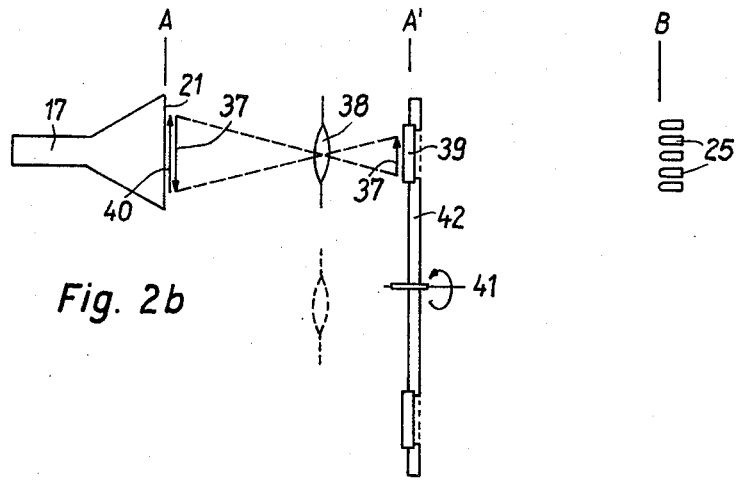

FIG. 2b shows a further arrangement for recording the reference object image. The image appearing on the television screen 21 (arrow 37) is imaged on the plane A' on a photographic plate 39 (arrow 37') using a lens 38 placed in the ray path. As will be seen from the ray path shown, the lens 38 causes a rotation of this image by 180° in addition to a desired 2:1 reduction of the television image. In order to orient the reference object image generated in the plane A' correctly, it is therefore necessary to rotate the television image by reversing the polarity of the deflection coils of the television tube 17 by 180° when recording the reference object image. After the reference object image in the plane A' is recorded, the lens 38 is removed from the ray path. Subsequently, the convolution product of the actual object image indicated on the television screen 21 (arrow 40) and the reference object image (arrow 37') is formed. As indicated on FIGS. 2b and 2c the photographic plate 39 may be part of a disc 42 rotatable about an axis 41. It carries several photographic plates 39, by means of which a time sequential series of reference object images can be prepared. These images are made by bringing the photographic plates 39 successively into the ray path of the lens 38.

Figure 2E:
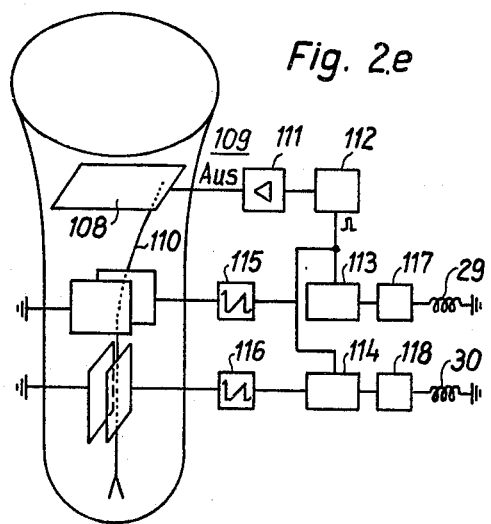
Figure 2C:
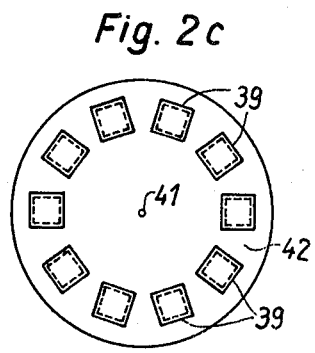

The arrangement of FIG. 2b, equipped with a disc as shown in FIG. 2c can be used for instance for making a focusing series of electron microscope images of the object to be examined without drift. For this purpose a series of reference object images is first made for different focusing planes on the specimen side of the objective lens 7. Subsequently, the focusing series itself is recorded on photographic plates. In such a case, the actual object image is always imaged on the television screen 21 and convolved with the corresponding reference object image of the disc 42 (FIG. 2c).

Variations of the arrangement shown in FIGS. 2a and 2b and consisting of the fluorescent screen 13, fiber optics 14, television camera 16 and the television display tube 17 for displaying the partial image 15 in the plane A are possible. In one of these, a front-view fluorescent screen whose image is picked up by a television camera through a viewing window of the microscope and is displayed on a television tube (in plane A) is provided instead of the fluorescent screen 13. The fluorescent screen can be tilted, if desired, in such a manner that it is parallel to the light entrance plane of the television camera.

Figure 2D:
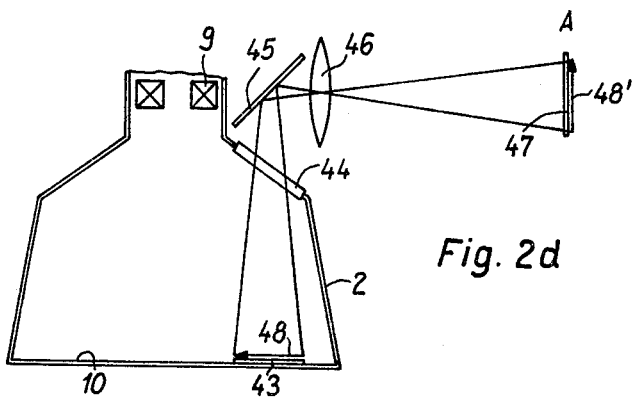

An alternative thereto is shown in FIG. 2d. The image of the top view fluorescent screen 43 (arrow 48) which is situated in the final image plane 10 of the electron microscope 2, is projected on a ground-glass screen 47 in the plane A (arrow 48') through a viewing window 44 of the microscope 2, a mirror 45 and a lens 46. The image obtained in this manner is processed as described in connection with FIGS. 2a and 2b.

FIG. 2e shows another arrangement for determining the position of the autocorrelation maximum present in the plane B. In this plane the signal pickup plate 108 of a vidicon camera tube 109, which is exposed to the autocorrelation signal is located. The coordinates of the autocorrelation maximum are now determined in the following manner: The output signal "Out" ("Aus") of the tube 109, which is obtained when the target plate 108 is scanned by the electron beam 110, is fed through an amplifier 111, to a discriminator 112 which is connected with two instantaneous value storage devices (sample-and-hold circuits) 113 and 114. The two storage devices 113 and 114 are connected to the two generators 115 and 116 for the sawtooth voltages of the horizontal and vertical deflection system of the scanning beam 110. If the scanning beam 110 is at the point of the autocorrelation maximum, the discriminator 112 delivers a pulse at its output. This causes the instantaneous horizontal and vertical deflection voltages of the two generators 115, 116 to be stored. If the actual object image drifts off (see FIG. 2a), then the autocorrelation maximum wanders off also. This results in a change of the voltage values fixed in the two storage devices 113, 114. For correcting the image displacement, each of the two storge devices is followed by an intergrating amplifier 117 or 118, which furnish a voltage proportional to the change in position of the autocorrelation maximum. This voltagee is fed to the deflection coils 29 and 30 of the electron microscope 2 (see FIG. 2a).

Figure 3A:
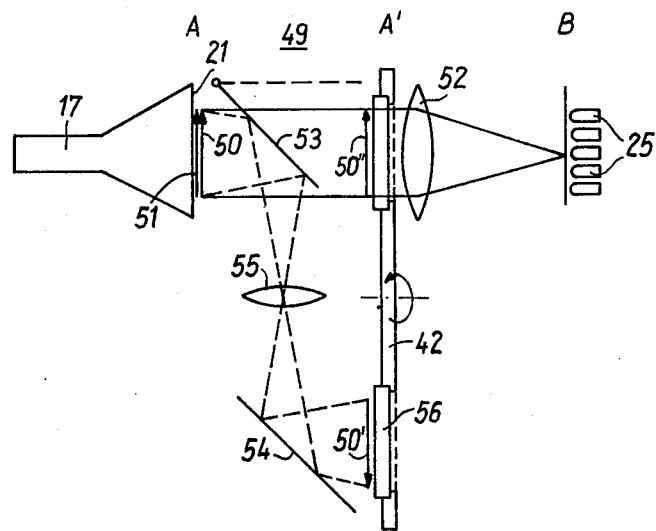
FIG. 3a is an optical schematic of an alternate embodiment of the computer of FIG. 2a in which the convolution product is generated using imaging lenses.

The light-optical computer 49 shown in FIG. 3a represents an alternative to the light-optical computer 1 of FIG. 2. The convolution of the reference object image with the actual object image is now accomplished by illluminating the reference object image (arrow 50'' in Plane A') with the actual object image (arrow 51 in Plane A) and focusing the passing rays by means of a light-optical lens 52 in the plane B (solid lines). The reference object image (arrow 50) initially present in Plane A is first projected by means of two mirrors 53 and 54 and a lens 55 at its actual size (arrow 50') in Plane A', as shown by the dashed ray path, and recorded on a photographic plate 56. It is rotated 180° relative to the television image (arrows 50 and 51). After the photographic plate 56 is developed, the latter is turned into the ray path of the computer 49, for instance, by means of the rotatable disc shown in FIG. 2c. The reference object image is now positioned with full size and with the correct orientation relative to the actual object image (arrow 51) which is now displaced on the television screen 21. To obtain the autocorrelation signal, the mirror 53 is swung upward out of the way.

Figure 3B:
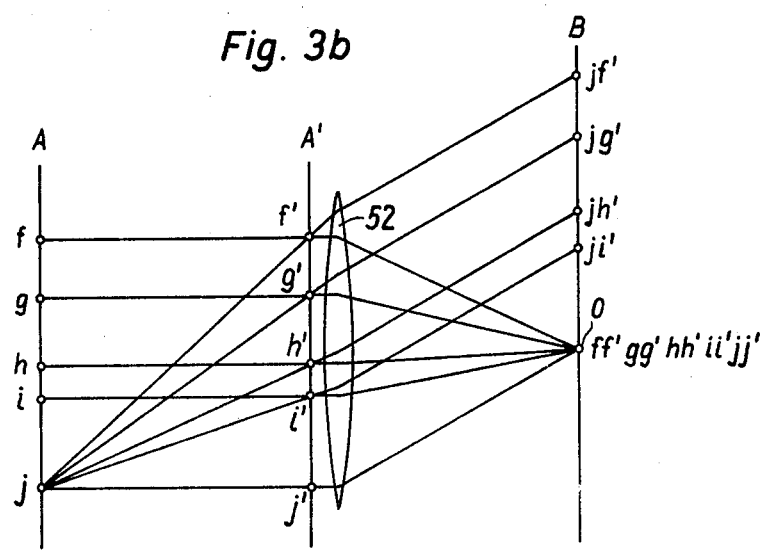

As shown in FIG. 3b in a one-dimensional function, the convolution product can also be formed by optical means using the arrangement of FIG. 3a. There are five luminous dots (corresponding to FIG. 1) $f$ to $j$ in the plane A. The plane A' carries a hole mask with a sequence of openings $f'$ to $j'$, corresponding to the point sequence on A. It can be seen with the aid of the rays drawn that in this case too there is only one point (at O) with 5 times the brightness of the other points in the plane B. The advantage of the light-optical computer 49 shown in FIG. 3a is that, due to the use of an imaging lens 52, a reduction of the reference object image is not necessary.

In the light-optical computers 1 and 49 shown in FIGS. 2 and 3, the reference object image is stored in the form of amplitude information. Another possibility for storing the reference object image is to store this image in the form of a phase object. This is possible, for instance, by means of a photothermoplastic layer or an electronic light relay tube (e.g. an Eidophor tube). As mentioned above, it is advantageous to arrange the reference and the actual object image on a linear grid (grid constant $k$) where storage of the reference object image in the form of a phase object is used.

Figure 4A:
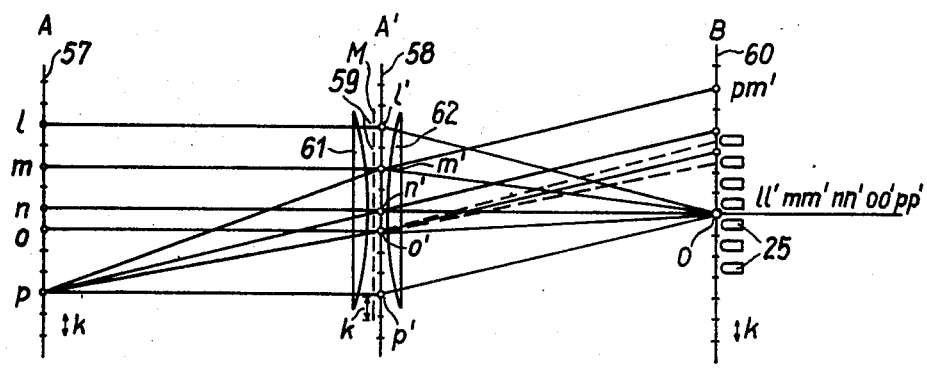

On FIG. 4a the one-dimensional case is considered first. In the plane A is again the actual object image, which is described by five luminous points 1 to p. The luminous points are arranged on a linear, superimposed grid 57 with the grid constant k. In the plane A' the reference object image 58, which is stored in the form of a phase object is located. At the points l' to p' it causes a phase shift of the passing light. On the reference object image 59 is superimposed a mask M provided with openings 59. The openings 59 have a mutual spacing k. Two lenses 61 and 62 enhance the symmetry of the ray paths.

The image on plane B will now be considered. Since all the passage openings 59 of the mask M pass the light rays emanating from the luminous points 1 to p on A without attenuation, if the phase object 58 is left out, a convolution of the linear function given by the arrangement of the light points on A with the linear function given by the arrangement of the passage openings 59 of the mask M on A' is obtained. This convolution results in a number of illuminated points in the plane B. These points are also arranged along a linear grid 60 with the grid constant k. If the phase object 58 is now inserted behind the mask M, it is found that each of the light rays emitted by the light points l to p and passing through an opening 59 of the mask M, corresponding to these light points, is accompanied, after passing through the phase object 58, by two satellite rays. This is shown by way of the light ray which emanates from the light point p and goes through the phase object 58 at o'. (The satellite rays are shown dashed).

If the photo diodes 25 arranged in matrix fashion are placed so that they respond to the space between the points of the linear grid 60, the correlation function given by the satellite rays of the actual object image 57 on A and the reference object image 58 on A' is obtained. In the two dimensional case an analogous point grid or line grid can be used for superimposing the actual and the reference object image respectively.

Figure 4B:
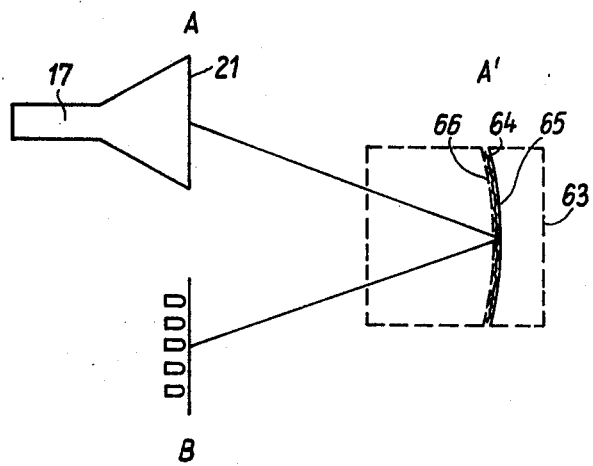

FIG. 4b illustrates apparatus using the principle shown in FIG. 4a. The reference object image is stored at A' in a tube constructed according to the Eidophor principle. A layer 64, the height of which is to be thickness modulated as a function of the reference object image to be stored is applied directly to a concave mirror 65. A line grid 66 is superimposed on the reference object image which is thus stored in the form of a phase object. The grid constant of this grid is equal to the "grid constant" of the actual object image present in the plane A in the form of a television image. The grid constant of the television image corresponds to the spacing of two succeeding image lines on the television screen 21.

Figure 5A:
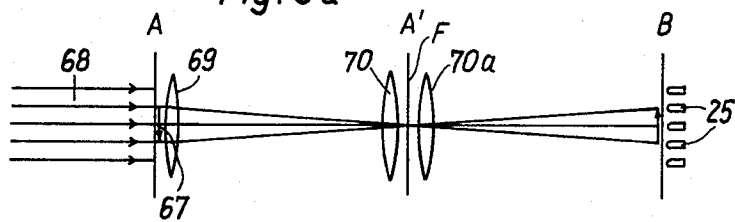
FIG. 5a is a optical schematic illustrating the principle involved in generating a Fourier transformation of an image and the multiplication of the Fourier coefficients of two images by optical means.

As mentioned above, a convolution of the actual object image with the reference object image (rotated 180°) can also be performed by forming the Fourier transform of the actual object image optically, multiplying it by the Fourier transform of the reference object image rotated 180° and generating an image by means of a lens. FIG. 5a shows the principle involved in generating a Fourier transformation of an image and the multiplication of the Fourier coefficients of two images by optical means. The image arranged in the plane A (arrow 67), which is present, for instance, in the form of a photographic plate, is illuminated from the rear with a laser beam 68 and focused by the lens 69 at its focal plane A'. Thus, a light diffractogram which is the Fourier transform of the image at A is generated in the plane A'. Two lenses 70 and 70a located immediately in front of and behind the plane A' produce an image of the pattern in A in their focal plane B.

Assume that the image at A (arrow 67) is identical with the actual object image. Assume further that between the two lenses 70 and 70a a filter F is inserted at A', on whose surface the Fourier transform of the reference object image, rotated by 180° is placed as an amplitude and phase distribution. This filter influences the mapping of the actual object image in such a manner that each Fourier coefficient of the image (arrow 67) developed by the lens 69 at A' is attenuated and phase rotated according to the corresponding Fourier coefficient impressed on the filter F. The mathematical relationship of this influence can be described by a multiplication of the Fourier coefficients of the mutually corresponding Fourier coefficients of the two images. As the multiplication in the Fourier space corresponds to a convolution in the direct space, the convolution of the actual object image with the reference object image (rotated 180°) is obtained at plane B. This convolution product contains a high maximum which is correspondingly displaced when the actual object image is displaced (drift). Photodiodes can again be used to ascertain this displacement and their outputs used as control signals for drift corrections.

Figure 5B:
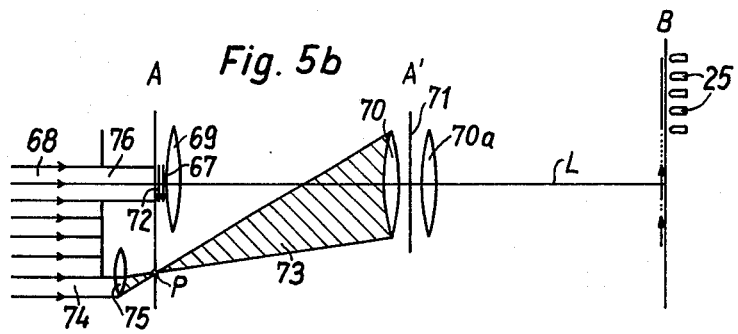
FIG. 5b illustrates apparatus for recording the Fourier transform of an image in the form of a hologram.

As explained above, it is common in practice to record the Fourier transform of an image by optical means in the form of a hologram. An actual embodiment of apparatus for carrying this out is illustrated by FIG. 5b. This apparatus permits the preparation of a special hologram, known as the Fourier transform hologram, of the reference object image as well as performance of a convolution of the reference and the actual object image.

First, the Fourier transform hologram of the reference object image is prepared as follows:

The reference object image is located in the form of a photographic plate at the plane A; it is illuminated from the rear by a portion 76 of a laser beam 68, so that a light diffractogram of the reference object image is produced at the focal plane A' of the lens 69. A coherent reference ray 73 is superimposed on this image to obtain the Fourier transform hologram which is then stored in a storage device, e.g. on a photographic plate. The reference ray 73 is formed by a futher portion 74 of the laser beam 68, using a lens 75. The lens 75 focuses the light of the laser at a point P of the plane A.

The convolution of the reference and the actual object image proceeds as follows:

The Fourier transform hologram 71 of the reference object image is now at the plane A'. It has superimposed on it a light diffractogram of the actual object image (arrow 67) which is also available on a photographic plate, the reference ray 73 being gated off. The light diffractogram is generated at the plane A' by directing the portion 76 of the laser beam 68 through the actual object image (67). At the plane B, a sequence of three images arranged on top of each other can now be seen. The first image, shown on the figure below the line L, represents the convolution of the actual object image with the reference object image. The second image, situated above the first one at the height of the line L, is identical to a triple convolution product, which is obtained when the actual object image is convolved with the reference object image and the reference object image rotated 180°. The third image, situated above the second one, and which is essential for the drift correction of the actual object image with the reference object image rotated 180°. Drift of the actual object image leads to wandering of the autocorrelation maximum proportionally to the drift, in this last image of the arrangement shown in FIG. 5b. This can be used to correct the drift in a manner similar to that described above.

Figure 5C:
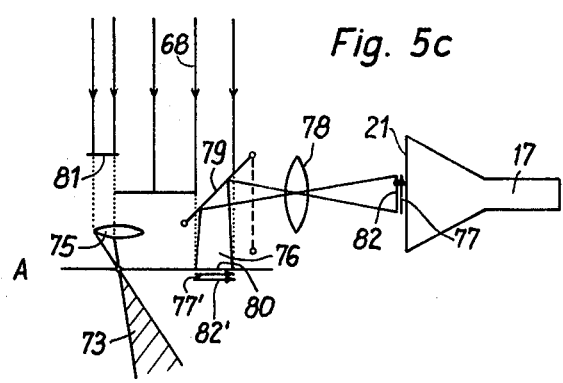
FIG. 5c shows an alternate to the apparatus of FIG. 5b in which the reference and actual object image are stored in the form of phase objects.

An alternative to the Fourier computer shown in FIG. 5b is shown in FIG. 5c. In this arrangement, the reference and the actual object image are stored in the form of phase objects. The reference object image (arrow 77) which is first displayed on a television screen, is processed through a light lens 78 and a mirror 79 which images the television image on a photothermoplastic film 80. As in FIG. 5b, a Fourier transform hologram of the reference object image (arrow 77') can be formed by illuminating the latter with a portion 76 of the laser beam 68, superimposing a reference ray 73, focusing at the focal plane A' of the lens 69 and storing it on a photographic plate at the plane A'. The autocorrelation signal can now be obtained at the plane B, as in FIG. 5b, with the reference ray gated off by shutter 81 and the actual object image (arrow 82') also stored on a photothermoplastic layer at A, illuminated by the laser beam 76. When a phase object at A is illuminated, the mirror 79 is swung into the position shown by the dashed line.

In the arrangements shown in FIGS. 5b and 5c, a comparison of the actual and the reference image is only possible intermittently, since the actual object image must first be stored by photographic or photothermoplastic means and then illuminated with coherent light. In order to achieve continuous convolution of the actual and the reference object image, the alternative embodiment shown in FIG. 5d is used.

Figure 5D:
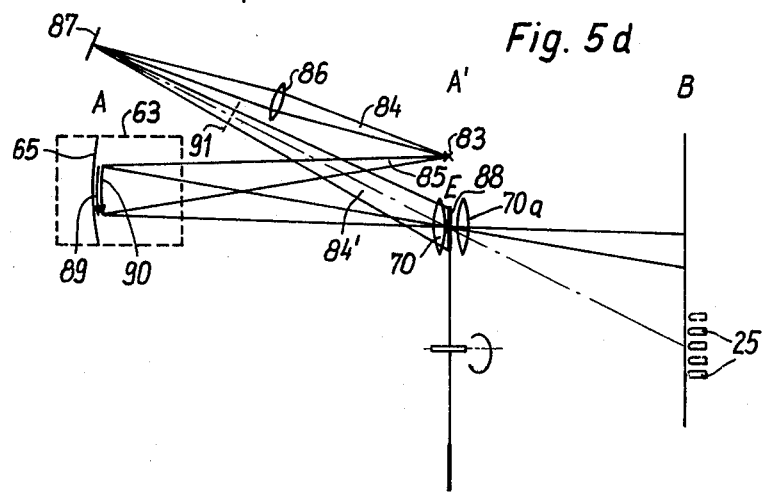
FIG. 5d illustrates a further alternate embodiment which achieves continuous convolution of the actual and reference object image.

In the arrangement of FIG. 5d, a light relay tube 63, e.g. an Eidophor tube, is used to display the reference and the actual image. From a point light source 83 generated by focusing a laser two ray bundles 84 and 85 emanate. Ray bundle 85 illuminates the Eidophor image. The other, ray 84, becomes a reference ray bundle 84' and illuminates a photothermoplastic layer 88 at the plane E after passing through a lens 86 and being reflected by mirror 87. The plane E is identical to the focal plane of the concave mirror 65 of the Eidophor tube.

The Eidophor image will first be chosen to be identical with the reference object image (arrow 89). This will cause the Fourier transform hologram of the reference object image to be first generated at the plane E by superposition of the reference ray 84' and the reference object image which is illuminated by the coherent light beam 85. After this hologram is stored, the reference ray 84' is gated off by shutter 91. If the Eidophor tube 63 now displays the actual object image (arrow 90), the convolution product of the reference object image rotated 180° and the actual object image is obtained at the plane B, as in FIG. 5b, as one of three images. The autocorrelation signal can be registered using photoelectric elements 25 in the manner described above.

Figure 6A:
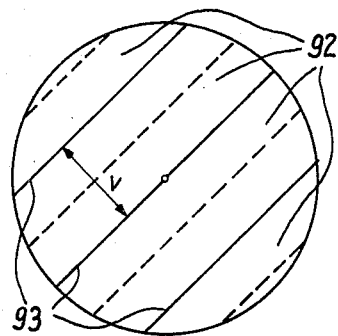
FIG. 6a illustrates schematically the elements of a light diffractogram employed in another alternate embodiment of the light-optical computer of the present invention.

FIG. 6a and b show another light-optical computer, in which the signal for the drift displacement is derived from the light diffractogram of a sum image of the actual and the reference object image illuminated with coherent light. The essential elements of the diffractogram are first shown schematically in FIG. 6a. The diffractogram shows, as noted above, a system of parallel, illuminated stripes 92 with dark lines 93 in between. The spacing v between two such lines 93 is proportional to the reciprocal of the drift distance u. The drift distance u is understood to mean the distance by which the actual object image is displaced relative to the reference object image.

Figure 6B:
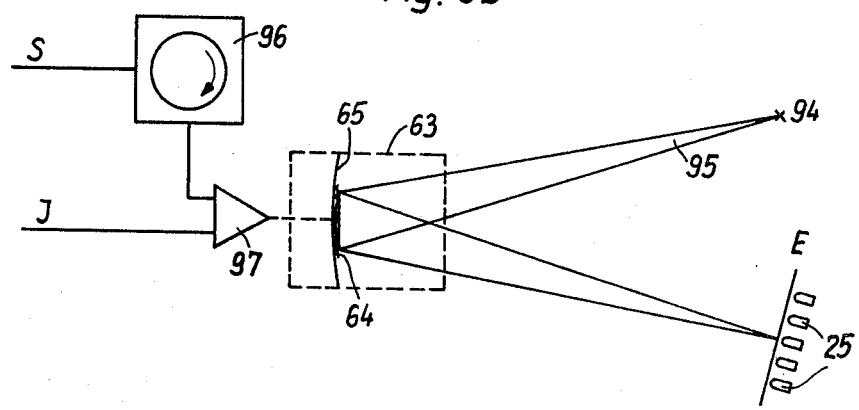

In FIG. 6b, the arrangement of a computer for obtaining the structure shown in FIG. 6a is illustrated. The arrangement consists of a light diffractometer which uses a laser beam 95 focused on the point 94 as a light source. The sum of the reference object image S and the actual object image I is impressed as a phase object on the concave mirror 65 of an Eidophor tube 63 in the form of a thickness modulated layer 64. The sum image can be obtained by registering the reference object image S as a track on a magnetic video disc and superimposing on it the actual object image I with an electronic adder 97. In the focal plane E of the concave mirror 65, the square of the Fourier transform of the sum image produced in the manner mentioned is generated; it has the zero lines shown in FIG. 6a. Photodiodes arranged in matrix fashion can then register the square of the Fourier transform of this image and evaluate it by drift coordinates using an electronic computer. The drift direction must still be determined separately. This can be done by a defined deflection of the actual object image.

The arrangements for drift compensation shown in the preceding figures can also be used to compensate the drift which occurs when an object is tilted about an axis. In this manner, an unequivocal correlation of the observed regions with the object tilted and not tilted is possible.

However, with such a tilt, more complicated situations occur than with the drift compensation of the images of objects which are not tilted. These will be explained with the aid of FIG. 7. An object 6 is tilted about an axis of rotation 100, which is perpendicular to the plane of the drawing (in the y-direction) by an angle $\alpha$. The object points 101 and 102 are thereby brought into the position 101' and 102'. The arrow 103 indicates the optical axis of the microscope (z-direction) and its objective lens is indicated schematically by a lens 104. Two broken lines 105 and 106 represent the limits of the object section T which is imaged in the final image plane, not shown, of the microscope.

The drift of the object 6' tilted by an angle $\alpha$ is now determined in the following manner: First, the image of the object section T is recorded before the object is tilted, for instance, by means of the arrangement shown in FIG. 2a, is reproduced on a television screen 21 and stored on a photographic plate. The stored image is identical with the reference object image. Subsequently, the object 6 is tilted by the angle $\alpha$, the section of the tilted object 6' corresponding to the object section T is designated by T'. The actual object image can then be obtained from the image of the object section T' present in the final image plane of the microscope. To understand this operation, assume that lines which run parallel to its axis 100 of rotation in the part T of the object 6 are reproduced vertically on the television screen 21 (in the y''-direction) of screen 21. As will be seen from FIG. 7, the image of the object section T' on the television screen 21 compressed horizontally by the factor cos $\alpha$. It is thus changed to the extent that correlation with the reference object image is not directly possible. In order to obtain a correlatable actual object image from the image of the object section T' reproduced on the television screen, it is therefore necessary to stretch the television picture to the format of the reference object image. This is done by increasing the horizontal deflection voltage U of the television raster, which causes a deflection of the electron beam proportional to the value of this voltage, by the factor l/cos α. A multiplier 107 is used for this purpose. The multiplier 107 which obtains an input from the tilting mechanism, causes an amplification of the horizontal deflection voltage U by the amount mentioned.

From the actual object image obtained in this manner, the autocorrelation signal can then be obtained by means of one of the light-optical computers described. Motion of this signal, depending on the tilt of the object, can then be nulled in the manner described above using servo devices and adjusting devices controlled thereby in a control loop. It should be noted at this point that for objects of finite thickness, the image tilt leads to a relative displacement of the object planes which in the untilted object 6 lie on top of each other, i.e., perpendicular to the optical axis. The result is a reduction of the brightness of the autocorrelation maximum and a broadening of this maximum perpendicular to the tilt axis. However, these effects are so slight that a sufficiently bright autocorrelation maximum is still obtained.

By means of the light-optical computers according to the invention, the defocusing of an object can also be determined as noted above. Defocusing means a change of the distance of the object from the focal plane on the specimen side of the objective lens. This change may be due either to a variation of the excitation of the objective lens or to a displacement of the object along the optical axis of the microscope. A change such as the latter is present, for instance, in the case of the described tilt of the object (see FIG. 7).

Figure 8:
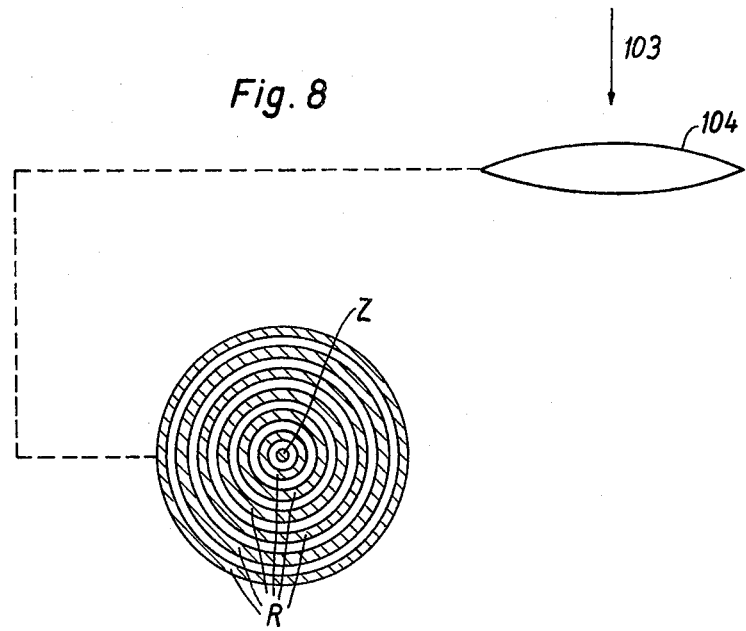

If a reference object image, i.e. the image of an object at an earlier point in time, is convolved with an actual object image rotated 180° to the object and whose distance from the focal plane on the specimen side is changed, it follows that the brightness of the autocorrelation maximum changes. At the same time, alternating illuminated and non-illuminated concentric rings appear. The position and illumination of these rings depends on the defocusing of the actual object image. The defocusing can therefore be ascertained by light detectors whose photoelectric elements are arranged concentric circular rings R and whose central detector Z is brought to the location of the autocorrelation maximum. FIG. 8 shows such a circular ring detector. The defocusing can be corrected using a control arrangement, not shown, by correcting the excitation current of the objective lens 104. The control device is controlled by the circular ring detectors according to FIG. 8.

In the object image that may be reproduced, for instance, on a television screen (FIG. 2a), clearly distinguishable and sharply delineated structures (markings) are frequently contained, which may be in the form of bright or dark picture areas. The commonly used specimen carrier films usually have holes, for instance, which can form such markings. Suitable markings can also be made by applying submicroscopic latex spheres in a well known manner to the object. These produce dark areas in the picture. If such markings are present, the invention can be simplified by using a prefabricated aperture whose shape coincides, at least approximately, with the shape of the marking as the stored reference object image. If the marking is formed, for instance, by a hole in the object, it may be sufficient to arrange an aperture with a circular opening whose diameter matches that of the marking in the plane A' (FIG. 2a). The convolution of the hole image with the aperture opening then furnishes a correlation maximum whose movement corresponds to the movement of the object (drift) at the plane B.

These and other modifications may be made without departing from the spirit of the invention which is intended to be limited solely by the appended claims.

I claim:

1. In a corpuscular beam microscope such as an electron microscope having adjusting means which result in a change in the object image, the improvement comprising:
    a. means for storing a reference object image;
    b. means for deriving a convolution of the actual microscope image with said stored reference object image; and
    c. means for evaluating said convolution to obtain an error signal to be used for setting said adjusting means.

2. Apparatus according to claim 1 wherein said reference object image is stored photographically.

3. Apparatus according to claim 1 wherein said reference object image is stored in an Eidophor tube.

4. Apparatus according to claim 1 wherein said means for evaluating comprise a position sensitive detector array and wherein said means for deriving comprise means to produce the actual object image on a flourescent screen and means for locating said stored reference object image between said flourescent screen and said detector array.

5. Apparatus according to claim 4 wherein said flourescent screen comprises the screen of a television display tube.

6. Apparatus according to claim 4 wherein said means for adjusting the object image includes means for positioning the object image along the direction of the equipment axis and wherein said detector array is arranged in the form of concentric rings of detectors.

7. Apparatus according to claim 1 wherein said reference object image is stored by phase and further including a grid structure impressed on the actual object image and a grid mask placed in the vacinity of said reference object image, the grid constants of the grid structure of said actual object image and said mask being equal.

8. Apparatus according to claim 1 and further including means to perform a Fourier stransformation of said reference object image and said actual object image and means to link the Fourier coefficient thereof by multiplication to furnish a Fourier transformation of the product.

9. Apparatus according to claim 8 wherein said means for evaluating comprise a position sensitive detector array and wherein said means for performing Fourier transformations comprise a coherent light source illuminating the object image and aligned with said detector array and a filter interposed between said actual object image and said detector array containing a helogram of the reference object image recorded such that a light defractorgram of the actual object image is produced on the filter.

10. Apparatus according to claim 1 wherein said means for deriving and means for evaluating comprise means which result in an error signal which is derived from the Fourier transformation of the convolution of the reference and actual object image.

11. Apparatus according to claim 10 wherein said Fourier transform of said convolution is the square of the Fourier transform of a double image superimposed from the reference and actual object image.

12. Apparatus according to claim 1 and further including means for automatically positioning said adjusting means and means coupling said error signal to said means for positioning.

* * * * *

UNITED STATES PATENT AND TRADEMARK OFFICE
CERTIFICATE OF CORRECTION

PATENT NO. : 3971936
DATED : JULY 27, 1976
INVENTOR(S) : WALTER HOPPE

Figure 7:
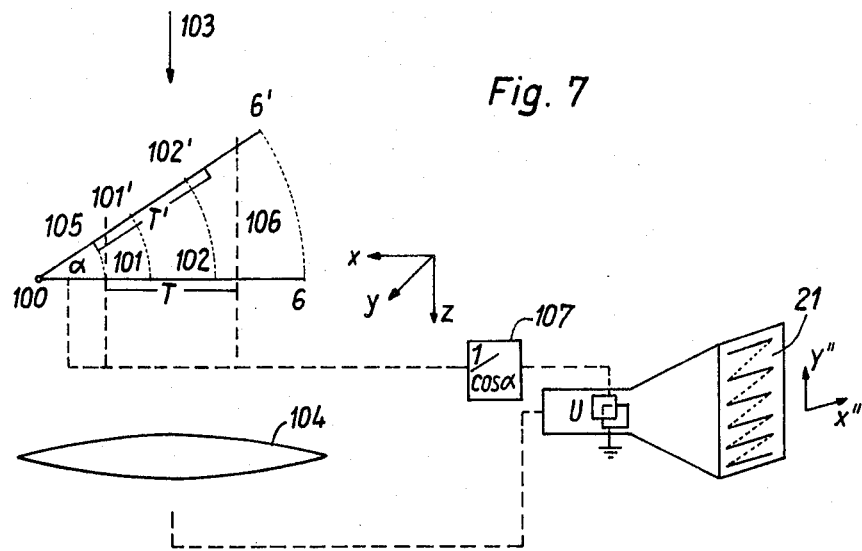

It is certified that error appears in the above—identified patent and that said Letters Patent are hereby corrected as shown below:

col. 3, line 10: insert the following paragraphs:

--Fig. 7, an arrangement for the examination of a tilted object, and

Fig. 8, an arrangement for examining a defocused object.--;

col. 12, line 47: delete "futher" and insert therefor

--further--;

Signed and Sealed this

First Day of February 1977

[SEAL]

Attest:

RUTH C. MASON
*Attesting Officer*

C. MARSHALL DANN
*Commissioner of Patents and Trademarks*